United States Patent [19]
Levy et al.

[11] Patent Number: 5,751,151
[45] Date of Patent: May 12, 1998

[54] INTEGRATED CIRCUIT TEST APPARATUS

[75] Inventors: Paul S. Levy; Ed Chenoweth, both of Chandler, Ariz.

[73] Assignee: VLSI Technology, San Jose, Calif.

[21] Appl. No.: 630,685

[22] Filed: Apr. 12, 1996

[51] Int. Cl.$^6$ ............................................... G01R 31/02
[52] U.S. Cl. ............................................ 324/537; 324/754
[58] Field of Search ................................. 324/537, 754, 324/757, 758, 761

[56] References Cited

U.S. PATENT DOCUMENTS

| | | | |
|---|---|---|---|
| 3,461,386 | 8/1969 | McCutcheon | 324/754 |
| 3,676,777 | 7/1972 | Charters | 324/754 |
| 4,168,527 | 9/1979 | Winkler | 324/73.1 X |
| 4,465,972 | 8/1984 | Sekolich | 324/754 |
| 4,719,459 | 1/1988 | Kovacs et al. | 324/73.1 X |
| 4,862,075 | 8/1989 | Choi et al. | 324/753 |
| 4,983,907 | 1/1991 | Crowley | 324/754 |
| 5,014,002 | 5/1991 | Wicombe et al. | 324/537 |
| 5,101,150 | 3/1992 | Sullivan et al. | 324/73.1 |
| 5,124,638 | 6/1992 | Winroth | 324/73.1 |
| 5,130,646 | 7/1992 | Kojima | 324/73.1 |
| 5,132,613 | 7/1992 | Papae et al. | 324/754 |
| 5,177,437 | 1/1993 | Henley | 324/754 |
| 5,402,079 | 3/1995 | Levy | 324/765 |

*Primary Examiner*—Glenn W. Brown
*Attorney, Agent, or Firm*—LaValle D. Ptak

[57] ABSTRACT

An integrated circuit test apparatus employs a main test circuit load board which has a circular array of relay card mounts located on it. Auxiliary relays, operated in conjunction with the load board, are mounted in groups on individual relay circuit cards, each card including several relays. The relay circuit cards have connectors on first and second edges thereof; and the connectors on the first edges interconnect with the corresponding receptacles on the relay card mounts. A customized configuration board load ring for the particular integrated circuit device under test (DUT) then is placed over the second edges of the relay circuit cards to interconnect with spring-loaded connectors on these edges to effect the configuration for the operation of the particular DUT which is undergoing test at any given time.

11 Claims, 2 Drawing Sheets

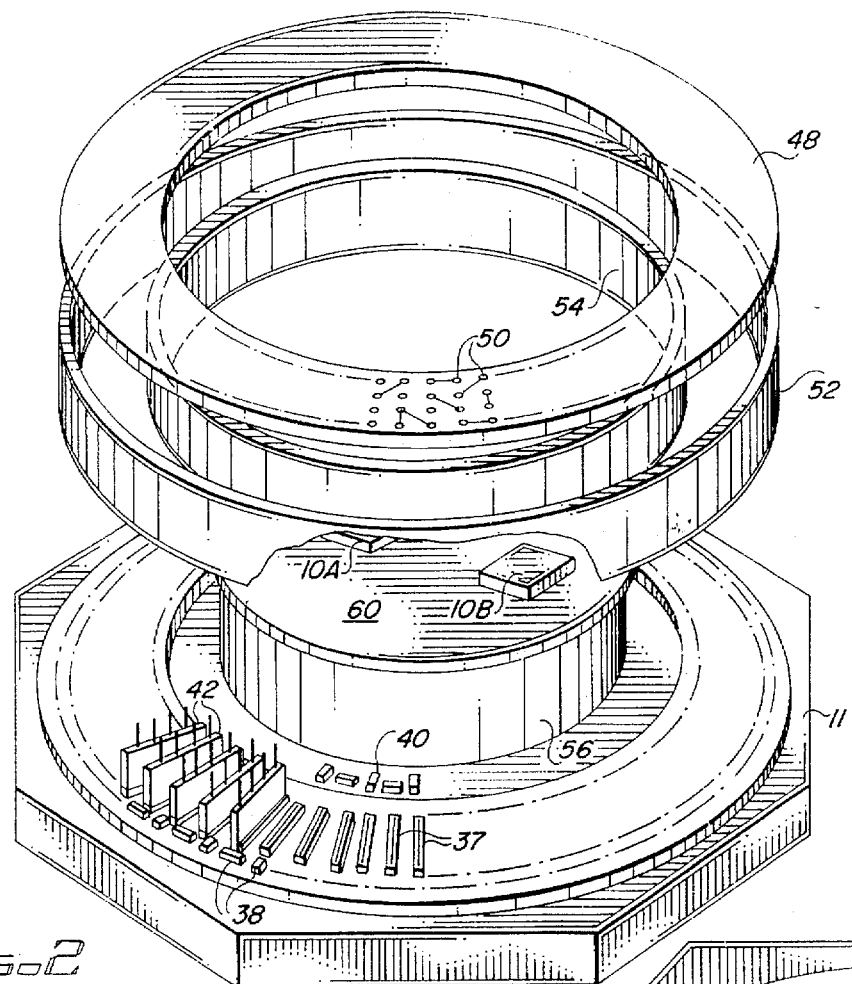
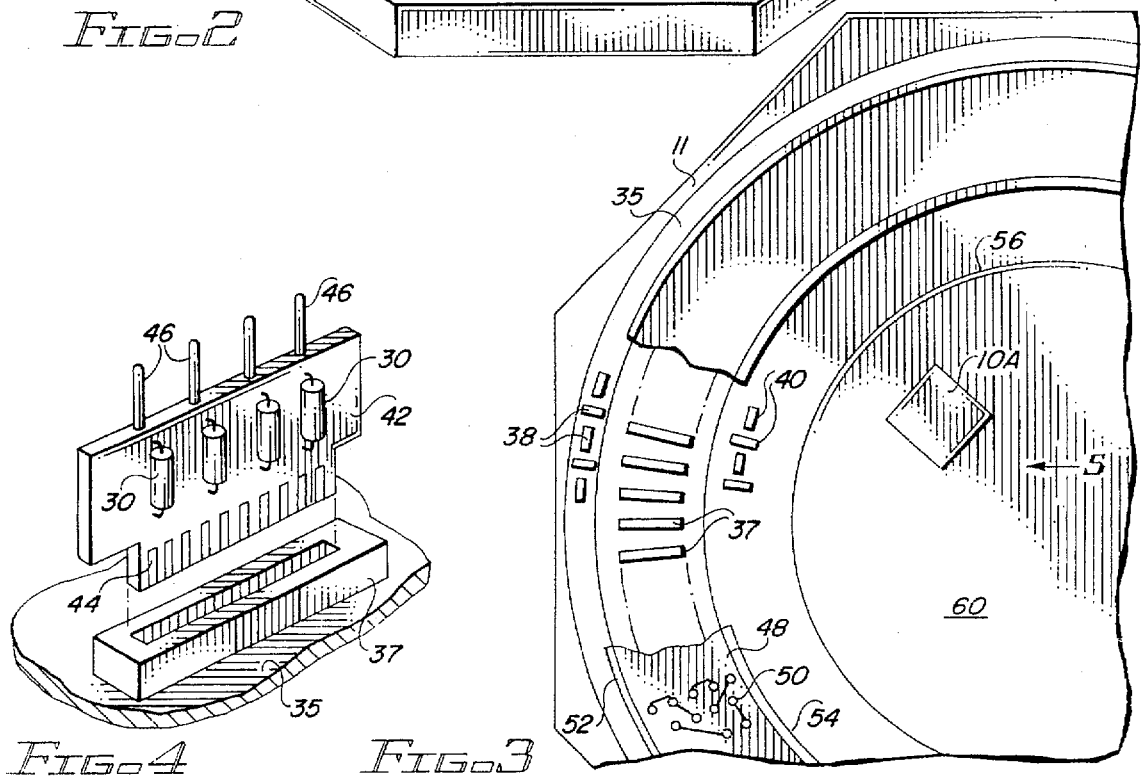

INTEGRATED CIRCUIT TEST APPARATUS

BACKGROUND

Integrated circuit devices currently are being manufactured with a large number of pins, which include input/output pins, pins to be connected with one or more supply voltages (VDD), and pins which are to be connected to ground in the operation of the device. Integrated circuit devices having sixty-four pins are common; and large scale integrated circuits, including up to 512 pins, currently exist.

Prior to the inclusion of such integrated circuit devices into equipment incorporating the devices, it is desirable to test the operating characteristics of the devices. This typically is done as a final step in the manufacture of the devices, and is accomplished by means of a multiple channel tester. Such testers are capable of applying required power supply and ground potentials to selected pins of the integrated circuit device under test, and also supply signals to and receive signals from the input/output (I/O) pins of the device under test. Typically, the integrated circuit test equipment is interconnected with an integrated circuit device under test (DUT) by means of a load board, which provides the desired interface between the tester and the device to be tested.

Load boards or performance boards for testing integrated circuit devices are relatively complex and expensive. Frequently, load boards are custom designed to provide a specific interface between a particular integrated circuit device which is to be tested and the test apparatus, which is used to operate the device during its test mode of operation. If the tester or test apparatus is always used to test the same integrated circuit devices, a dedicated load board for interfacing between the tester and the integrated circuit device is practical. If a different integrated circuit device, however, having the same number of pins but arranged in a different order, or devices having different numbers of pins are to be tested, it has been necessary to have a different specific dedicated load board for each different integrated circuit device. For a company manufacturing many different types of integrated circuit devices, or for a company using many different types of integrated circuit devices, the provision of dedicated load boards for each different device becomes quite expensive.

Universal load boards have been designed which are capable of interfacing different integrated circuit devices undergoing test with a tester system. When a universal board is used, the board must have the capacity to set any of the interface channels to match any of the channels of the tester to any one of the pins on the integrated circuit device undergoing test, to operate either as an input/output pin, or to be connected to ground or to a source of power (VDD). This is accomplished by providing separate power supply attribute relays on the universal load board or performance board for each of the channels. In the past, manually set toggle switches have been used as memory devices for activating selected ones of the relays in accordance with the desired interconnections which are to be effected between the tester and the integrated circuit device under test. The time required for setting each of these toggle switches is considerable in view of the large number of pins on the DUT, which must be correctly connected for effecting the test operation. It also is necessary to carefully check the switch settings prior to operation of the tester to ensure that no errors exist, because errors would invalidate the subsequent tests to be run. Substantial potential for error exists in such a system.

An improved system for automating the relay selection is disclosed in the Levy U.S. Pat. No. 5,402,079. The system of the Levy patent utilizes a programmable relay control circuit for setting up the relay control operations in response to control information supplied from an integrated circuit tester system. The control information is based on software in the integrated circuit tester; so that the relay control circuit then is automatically programmed in accordance with the configuration of the particular DUT which is to undergo test. The program for that DUT is used to operate the relay control circuit; so that the relays are selectively operated, automatically, without requiring any manual switch selection. This is a significant improvement over the manual switch selection in existence prior to the system disclosed in the U.S. Pat. No. 5,402,079.

Even though the system of the above identified Levy patent constitutes a significant improvement over the prior art, a problem still exists in the mounting, repair and replacement of the large numbers of relays required in the system. This is particularly true of testing systems which operate to test two or more DUT devices simultaneously through a "flip-flop" selection of one and then the other of the devices under test for speeding up the test operations. The large number of relays requires a substantial amount of test board "real estate"; so that locating these relays, along with all of the other circuitry, is a significant problem.

The Choi U.S. Pat. No. 4,862,075 is directed to a high frequency test head in which the pin driver boards for the test apparatus are positioned radially about the test platform to minimize the distance between the device under test and the pin driver boards. This circular array of vertically mounted boards permits the circuitry for the test apparatus to be located in a relatively small volume. The array which is used essentially is a replacement for conventional flat circular load boards. The manner of locating and dispersing relays, however, is not addressed by the Choi device. It appears that the relays are mounted in the various circuit configurations on the different pin driver boards; so that access to these individual relays and their repair or replacement still is difficult.

The Charters U.S. Pat. No. 3,676,777 discloses a plurality of reed switches (relays) mounted on a probe board in an integrated circuit test apparatus. The Charters patent includes various circuit boards with the sampling probes plugged into sockets on the grounded mounting ring to extend radially outward to reduce inductance and require less space. The manner in which large numbers of relays (on the order of hundreds of relays) and convenient location of such relays for maintenance and replacement is not addressed in this patent.

It is desirable to provide an improved tester system having a relay interface between a load board and a device under test (DUT), which can accommodate large numbers of relays, which is relatively compact in arrangement, and which provides ready access to individual relays or groups of relays for repair and replacement.

SUMMARY OF THE INVENTION

In accordance with a preferred embodiment of the invention, a relay interface system used in conjunction with an integrated circuit tester employs an array of relay card mounts. Individual relays for the tester are mounted on vertically oriented cards, which are inserted into each of the mounts. The upper edges of the relay mounting cards, each of which have a plurality of relays mounted on them, include spring-loaded connector pins for engaging a DUT configuration board which is uniquely associated with the particular devices which are to be tested by the system. Removal of the configuration board permits individual removal and/or replacement of different ones of the relay cards, in the event that failure of any given relay on a card takes place, to facilitate replacement of defective relays.

BRIEF DESCRIPTION OF THE DRAWINGS

FIG. 2 is an exploded perspective view of a preferred embodiment of the invention;

FIG. 3 is a top partially cut-away view of the embodiment shown in FIG. 2;

FIG. 4 is an enlarged perspective detail of a portion of the embodiment shown in FIG. 2.

DETAILED DESCRIPTION

Figure 1:
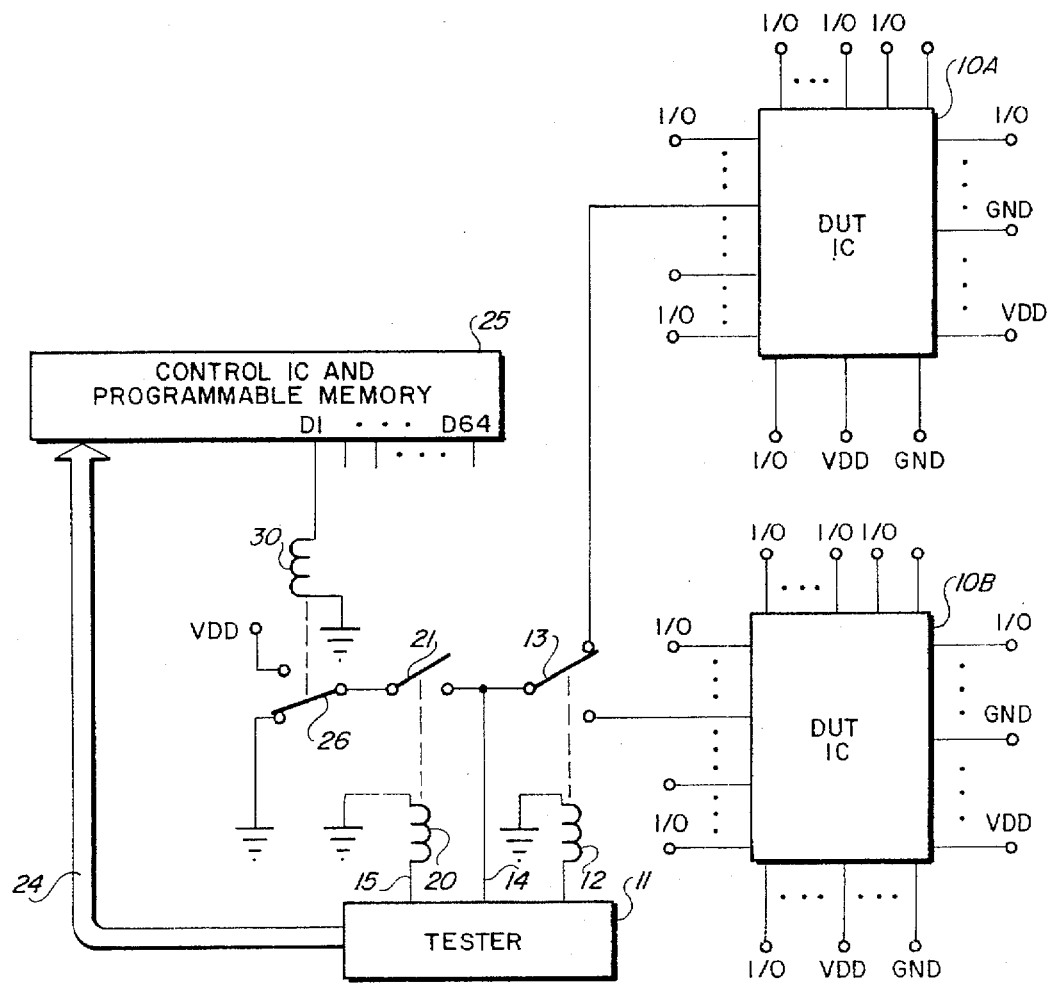
FIG. 1 is a circuit diagram of a system with which the preferred embodiment of the invention is used.

Reference now should be made to the drawings, in which the same reference numbers are used throughout the different figures to designate the same components. FIG. 1 is a block circuit diagram of an integrated circuit relay control system of the type shown in U.S. Pat. No. 5,402,079. This system is used in conjunction with a universal performance board interface between an integrated circuit device under test (DUT) 10A or 10B and a tester system 11. The system shown in FIG. 1 employs alternate testing of the devices 10A and 10B, each of which includes a large number of pins. As is well known, each of the pins are specifically designated by the manufacturer for attachment to input/output (I/O) leads, operating power supply VDD, or ground (GND). A small number of such leads are indicated as expending from the four sides of each of the integrated circuit packages 10A and 10B in FIG. 1; and some of these leads (or pins) are labeled with different ones of these designations, namely I/O, VDD, and GND.

When the devices 10A and 10B are to be tested, different output leads from the tester 11 are connected through the performance board or load board of the tester to the various pins (leads) of the device under test (DUT) 10A or 10B. In order to avoid cluttering of the drawing, only one of these connections, to only a single pin of each of the DUTs 10A and 10B, is illustrated in FIG. 1. For each such output lead, such as the lead 14 from the tester 11, a companion lead 15 also is provided to supply power through the operating coil 20 of a tester utility relay, the other end of which is connected to ground. In addition, a third lead is used to provide power through the operating coil 12 of a "flip-flop" relay to alternately operate a contact 13 to connect the input pin of the DUT 10A to the tester circuit for one time interval, and subsequently to disconnect the DUT 10A and connect the corresponding input pin of the relay 10B to the tester for the next time interval to effect alternate testing of the DUT ICs 10A and 10B. If the "flip-flop" operation for switching the testing back and forth between two different DUT devices 10A and 10B were not desired, and only a single device were to be tested, the relay coil 12 and contact 13 could be eliminated.

Whenever power is applied over the lead 15 through the coil 20, a normally open relay contact 21 is closed. It is apparent that the contact 21 is connected to the same electrical connection point on the selected pin of the DUT 10A (or 10B), as is the lead 14. When the contact 21 is open, as illustrated in FIG. 1, all of the signals to the connected pin of the DUT 10A (or 10B) are I/O signals supplied to or from the tester 11 over the lead 14. Similar pairs of tester leads for connection to each of the different pins on the DUT devices 10A and 10B, and associated utility relays similar to the utility relay 20, are provided for all of the pins of the DUTs 10A and 10B. Thus, it is readily apparent that a large number of relays 20 must be employed, particularly if the DUT devices 10A and 10B are large scale integrated circuits having 512 leads or more on them.

The tester 11 effects the interface connections to the DUT devices 10A and 10B through a universal load board or a universal performance board, which actually completes the electrical interconnections. Whenever a pin of the DUT devices 10A and 10B is an input/output (I/O) pin, the corresponding utility relay contact 21 for that pin is open; so that the input/output (I/O) signals required for the test are passed between the tester 11 and the input pin of the DUT 10A or 10B (via the lead 14, for example).

For those pins of the DUTs 10A and 10B which must be connected either to ground or to operating potential (VDD), the corresponding relay switch, such as the switch 21, is closed by applying operating potential to its operating coil, such as the coil 20 shown in FIG. 1. This then permits either around potential or VDD potential to be applied through the now-closed switch contact 21 to the pin, in accordance with the operating position of another relay contact 26, illustrated in FIG. 1 as normally connected to ground potential.

If VDD potential is to be applied to the corresponding pin of the DUT 10A and 10B, a corresponding relay coil, such as the relay coil 30, is operated to pull the contact 26 from its lower position to its upper position, where it then is attached to a source or operating potential (VDD) as illustrated in FIG. 1. Operation or the relay 30 (and corresponding relays for each one of the pine or the DUT devices 10A and 10B) is effected by means of a control IC and programmable memory 25. It should be noted that while only one relay coil 30 is shown as operated by the IC 25, large numbers of contacts (up to the number of pins on the DUT devices 10A and 10B under test) are provided. Only one of these relays and its connection to the control circuit 25 is illustrated to avoid unnecessary cluttering of the drawing. The control circuit 25 and switch 26 also could be replaced with a simple jumper to VDD or ground, as required.

The signals for determining which of the various relays 30 (only one of which is shown in FIG. 1) are to be activated or operated by the control circuit 25 is obtained by way of programming signals and clock signals applied over a bus 24 from the tester 11. This is described in greater detail in U.S. Pat. No. 5,402,079, which is incorporated herein by reference.

It readily is apparent from an understanding of the foregoing description of the operation of the circuit shown in FIG. 1, that large numbers of relay coils 20 and 30 are required for the system. Even when these relay coils 20 and 30 are automatically operated by a programming control or software control in the tester 11, the sheer number of these relays creates a mounting or real estate problem on the load board for the tester 11. In addition, if afailure of any given relay takes place, replacement and/or repair of such a relay, when it is mounted on the load board, requires considerable effort and exposes adjacent circuit components on the load board to possible damage when the soldered relay connections are broken and re-established.

To overcome the problem of locating the relays and facilitating their removal and replacement, the physical configuration shown in the exploded diagrammatic view of FIG. 2 has been devised. The tester 11 has a circular load board 35 mounted on it or associated with it. The load board 35 is provided with signals to and from the tester 11 in a conventional manner; and the load board 35 includes large numbers of components 38 and 40 mounted on it and interconnected in a conventional manner to effect the various circuit interconnections required for operating the test sequence of the DUTs 10A and 10B.

As illustrated in FIG. 2, a circular array of edge connectors 37 are provided on the load board between the components 38 and 40 around the entire central axis of the board 35. These connectors 37 include receptacles or card edge controls 44 extending from edge mounted relay cards 42 (best shown in FIG. 4). Each of the cards 42 has a plurality of relays 30 mounted on it, only four of which are shown in FIG. 4. The number of relays on each of the cards may vary from the four shown in FIG. 4 to greater numbers, such as ten, if desired. Relays 30 may be mounted on one or both sides of the cards 42, depending upon the particular requirements of the system to which they are to be used. The relay connections then are effected from the circuit interconnections (not shown) on the load board 35, with the connectors 37 into which the card edge controls 44 are inserted, and through the relays 30 to spring-loaded connector pins 46 located on the upper edges of each of the relay cards 42.

The interconnections to be effected from the spring-loaded connector pins 46 on the upper edge of each of the relay cards 42 are made through corresponding mating receiving contacts on the underside of a configuration board load ring 48. The configuration board load ring 48 has contacts 50 selectively located for interconnection with corresponding ones of the spring-loaded pins 46 on corresponding ones of the relay cards 42 to effect the desired circuit interconnections.

The load ring 48 includes active and passive components on it for a custom configuration board connected through the appropriately operated relays 30 located on the cards 42. By locating product specific load and power requirements on a removable configuration board load ring 48, cost and lead times for the creation of customized load boards are reduced. The load board 35 includes all of the generic components on it, with the customization taking place on the configuration board load ring 48. The spring pin connectors 46 on the top of each of the relay cards 42 are connected (or blocked from connection) in a conventional manner by appropriate contacts (or the lack of them) on the underside of the ring 48.

Figure 5:
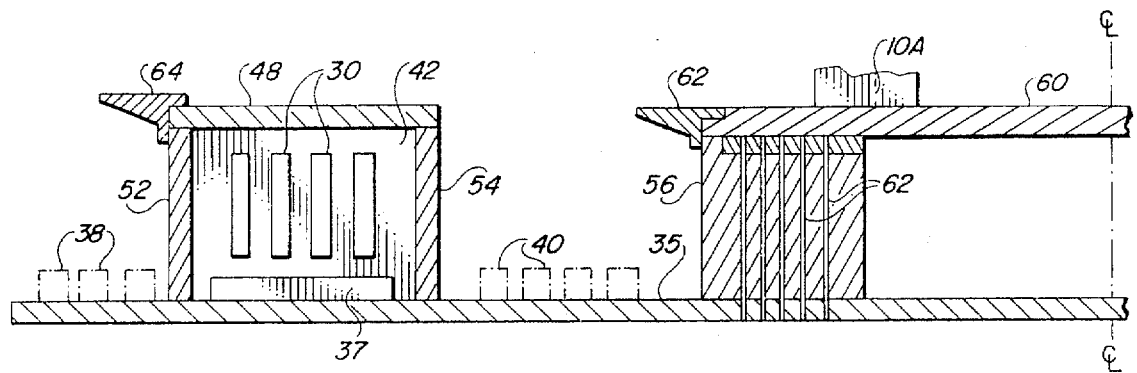
FIG. 5 is a diagrammatic cross-sectional view taken along the line 5—5 of FIG. 3.

Once the appropriate load ring 48, designed specifically to operate with the DUTs 10A and 10B for a particular test sequence, has been selected and pressed into place on the spring-loaded pins 46 of the relay cards 42, a pair of cylindrical section insulating card cage rings 52 and 54 are placed outside and inside the load ring 48, respectively, to secure everything in place against lateral movement with respect to the load board 35. This is shown most clearly in FIGS. 3 and 5.

The center of the load board 35, an interface block 56 is located. This block is attached to the load board 35 by way of spring-loaded pins 62, which extend into appropriate connectors in the load board 35, and from there to the underside of a DUT mounting board 60. The DUT devices 10A and 10B are mounted through their respective pin connectors to corresponding connections on the upper surface of the board 60. The particular surface interconnections will vary depending upon the different types of DUT devices 10A and 10B used and upon the number of connector pins which extend from the various devices. Since these interconnections are common and well known in the art, they are not shown in any of the figures. Once the DUT, mounting board 60 is in place and the configuration board load ring 48 for customizing the load board operation are in place, as shown most clearly in FIG. 5, retaining rings 62 and 64, of a type commonly used, are used to hold the various components in place.

By employing an interface system with the relays mounted on the edge mounted cards 42 in the manner described above, an efficient packing of the relays is achieved. In addition, easy replacement, on an individual card 42 basis, is achievable in the event failure of any relay takes place. Each relay card 42 holds several relays; and the relay select logic, if needed, is located on the main load board 35.

The foregoing description of the preferred embodiment of the invention is to be considered as illustrative and not as limiting. Various changes will occur to those skilled in the art for performing substantially the same function, in substantially the same way, to achieve substantially the same result, without departing from the true scope of the invention as defined in the appended claims.

What is claimed is:

1. An integrated circuit test system including in combination:

a main test circuit load board having a plurality of relay card mounts thereon;

a plurality of relay circuit cards each having at least one relay mounted thereon, and each having first and second edges, with a plurality of edge connectors on said first edge removably inserted into a corresponding one of said relay card mounts, and a plurality of spring-loaded connector pins on said second edge;

a configuration board having mating connectors on it for releasable electrical connection to the spring-loaded connector pins on said second edges of said relay circuit cards, whereupon removal of said configuration board leaves said relay circuit cards in place on said main test circuit load board and leaves said relay circuit cards exposed for ready access and replacement.

2. The combination according to claim 1 wherein each of said relay circuit cards has a plurality of relays mounted on the surfaces thereof between said first and second edges.

3. The combination according to claim 2 wherein said relay card mounts are located in a circular array and said configuration board is a circular ring.

4. The combination according to claim 3 further including a device under test (DUT) board adapted for connection with a DUT, and an interface connected between said load board and said DUT board to effect electrical interconnections to said DUT via said DUT board, said interface and said load board.

5. The combination according to claim 4 further including electrical connections on said load board between said relay card mounts and said interface.

6. The combination according to claim 5 further including at least two DUTs on said DUT board; and circuit means for selecting one of said at least two DUTs for test.

7. The combination according to claim 1 further including a device under test (DUT) board adapted for connection with a DUT, and an interface connected between said load board and said DUT board to effect electrical interconnections to said DUT via said DUT board, said interface and said load board.

8. The combination according to claim 7 further including electrical connections on said load board between said relay card mounts and said interface.

9. The combination according to claim 8 further including at least two DUTs on said DUT board; and circuit means for selecting one of said at least two DUTs for test.

10. The combination according to claim 1 wherein said relay card mounts are located in a circular array and said configuration board is a circular ring.

11. The combination according to claim 10 wherein each of said relay circuit cards has a plurality of relays mounted on the surfaces thereof between said first and second edges.

* * * * *